(12) United States Patent
Lu et al.

(10) Patent No.: US 7,626,251 B2
(45) Date of Patent: Dec. 1, 2009

(54) MICROELECTRONIC DIE ASSEMBLY HAVING THERMALLY CONDUCTIVE ELEMENT AT A BACKSIDE THEREOF AND METHOD OF MAKING SAME

(75) Inventors: Daoqiang Lu, Chandler, AZ (US);
Chuan Hu, Chandler, AZ (US);
Dongming He, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 11/529,851

(22) Filed: Sep. 29, 2006

(65) Prior Publication Data
US 2008/0079125 A1    Apr. 3, 2008

(51) Int. Cl.
*H01L 23/10* (2006.01)
(52) U.S. Cl. .............. 257/675; 257/706; 257/707; 257/719; 257/E23.051; 257/E23.101

(58) Field of Classification Search ................. 257/276, 257/625, 675, 707, 712–722, 796, E33.075, 257/E31.131, E23.051, E23.08–E23.113
See application file for complete search history.

(56) References Cited

U.S. PATENT DOCUMENTS

| | | | | |
|---|---|---|---|---|
| 6,114,761 | A * | 9/2000 | Mertol et al. | 257/722 |
| 7,148,122 | B2 * | 12/2006 | Shaheen et al. | 438/455 |
| 2002/0105071 | A1 * | 8/2002 | Mahajan et al. | 257/720 |
| 2007/0216009 | A1 * | 9/2007 | Ng | 257/690 |
| 2007/0262421 | A1 * | 11/2007 | Lehman et al. | 257/642 |

* cited by examiner

*Primary Examiner*—Jasmine J Clark
(74) *Attorney, Agent, or Firm*—Blakey, Sokoloff, Taylor & Zafman LLP

(57) ABSTRACT

A microelectronic die assembly. The die assembly includes a microelectronic die, and a thermally conductive element attached to the backside of the die with a thermal interface material. The thermally conductive element has lateral dimensions smaller than, substantially equal to, or larger than lateral dimensions of the die by up to a maximum amount, wherein the maximum amount is adapted to allow a mounting of the die assembly to a package substrate.

9 Claims, 7 Drawing Sheets

US 7,626,251 B2

MICROELECTRONIC DIE ASSEMBLY HAVING THERMALLY CONDUCTIVE ELEMENT AT A BACKSIDE THEREOF AND METHOD OF MAKING SAME

FIELD

Embodiments of the present invention relate generally to the field of microelectronic fabrication. More specifically, embodiments of the present invention relate to packaging a microelectronic die.

BACKGROUND

Processors and related computer components are becoming more powerful with increasing capabilities, resulting in increasing amounts of heat dissipated from these components. Similarly, package and die sizes of the components are decreasing or remaining the same, which increases the amount of heat energy given off by the component for a given unit of surface area. Furthermore, as computer-related equipment becomes more powerful, more chips are mounted to the printed circuit board, and more and more components are being placed inside the equipment or chassis which is also decreasing in size, resulting in additional heat generation in a smaller volume of space. Increased temperatures can potentially damage the components of the equipment, or reduce the lifetime of the individual components and equipment. In addition, some components, such as ILD layers in microelectronic dies, are more susceptible to damage resulting from stress and strain occurring during testing, packaging, and use.

For example, part of a process flow for packaging a microelectronic die may include flip chip attach processes, which typically involve a reflow of solder bumps to form solder joints between a die and substrate. Usually, temperatures necessary to reflow the solder bumps lead to an expansion of each of the die and the substrate. During cooling, different shrinkage amounts of the die and substrate could lead to cracks within the die, especially when a mechanically weak interlayer dielectric (ILD) is used on the die. The ILD of the die usually tends to experience increased thermo-mechanical stresses in the area under the solder joints during die and substrate attach, which stresses lead to increased under bump ILD cracking. Because of the above disadvantages with effecting a direct joining of die and substrate, as mentioned above, underfill materials are sometimes used to redistribute the stress generated due to the CTE mismatch across the whole package. However, disadvantageously, in view of a trend toward using ultra low-k inter layer dielectrics (ILD's) as part of microelectronic dies, sometimes even the use of underfill materials cannot compensate for the resultant increased fragility of the die in the face of CTE mismatches during testing, packaging and use.

Another part of a process flow for packaging a microelectronic die may bonding a microelectronic die to a heat spreader, which may involve a packaging technology that places one or more thinned dice on a planar heat spreader and secures the dice on to the heat spreader using a bonding process involving an adhesive material, such as solder, or a polymeric material, or, in the alternative, using a direct metallurgical bond, such as may be formed by an interdiffusion of Au (gold) and Si (silicon). Where a metallurgical bond is to be established as noted above, such a prior art process however requires a heating of the die/heat spreader assembly in order to form the bond. Disadvantageously, however, heating to create the bond as noted above may involve temperatures from about 150 to about 300 degrees Celsius, and may as a result, similar to the flip chip process, create unwanted stresses and cracking involving the die, the heat spreader and/or the bonding material (or thermal interface material, hereinafter "TIM") therebetween during a cool down phase of the bonding process. Unwanted stresses on the die can disadvantageously have a negative impact on the performance of circuit components on the die.

In order to overcome the above disadvantages, the prior art has proposed the use of thin die thin thermal interface material (TIM) typically involving the use of dies having a thickness of about 100 microns or less. The use of cooling microchannels have also been explored by the prior art as a potential thermal solution for future microelectronic packages. Thin die thin thermal interface material (TDTT) dies, however, typically use relatively large heat spreaders that make the handling of the package during a mounting of the die onto the substrate difficult. Moreover, micro-channels are typically expensive to produce, requiring extra components such as pumps and pipes, ad thus further introducing added reliability issues with respect to package cooling. In addition, the use of ceramic or other lower CTE substrates have been proposed to address the results of a CTE mismatch between the substrate and a die. However, such substrates are more expensive and have a higher dielectric constant than typical substrates, and can thus have a negative effect on the performance of the package as a whole.

The prior art fails to provide a reliable, simple and cost-effective technique of providing a microelectronic die exhibiting improved heat dissipation characteristics.

Figure 1:
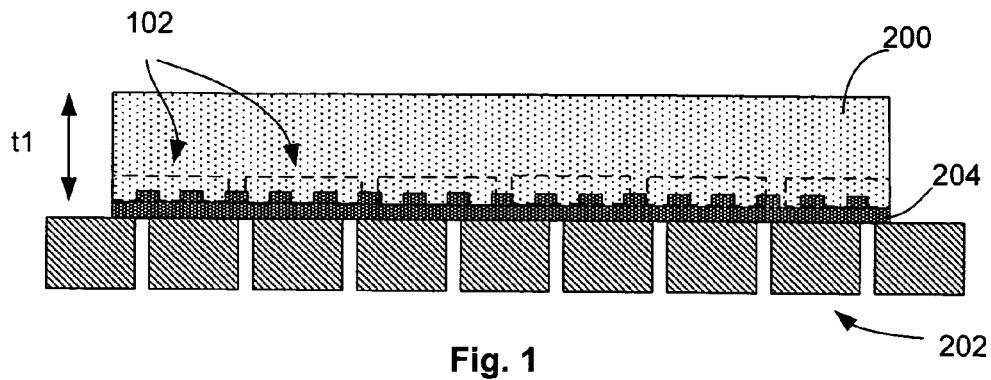
FIGS. 1-3b are schematic views showing stages in the formation of a die from a die wafer supported on a wafer carrier according to an embodiment.
Figure 2:
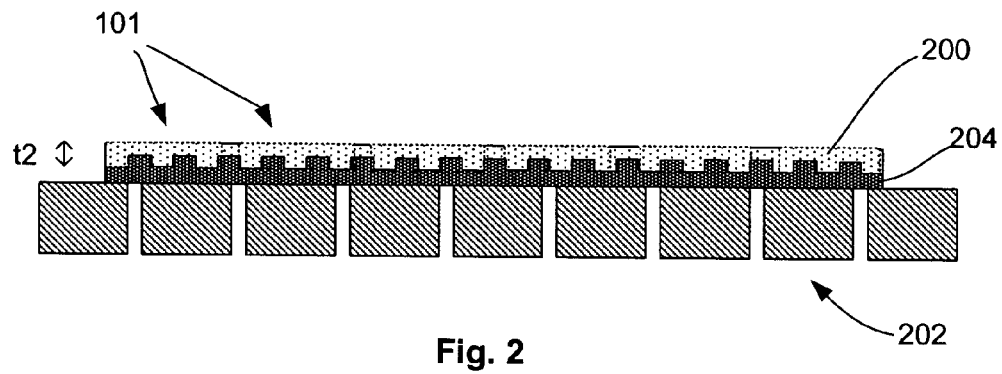

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic die, a microelectronic package, and a method of fabricating the microelectronic die are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that FIG. X shows element A and FIG. Y shows element B.

Aspects of this and other embodiments will be discussed herein with respect to FIGS. 1-8, below. The figures, however, should not be taken to be limiting, as they are intended for the purpose of explanation and understanding.

Figure 5A:
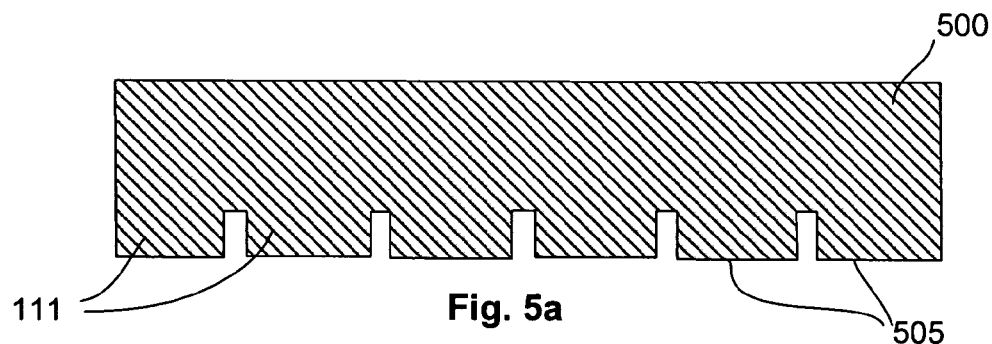
FIGS. 5a-5e are schematic views showing stages in the formation of a microelectronic die assembly using the dies of FIG. 3b according to a second embodiment.
Figure 5B:
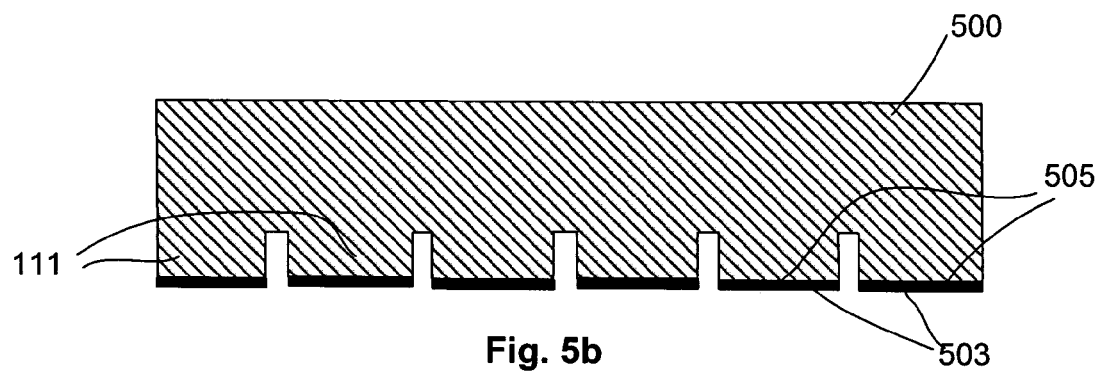
Figure 5C:
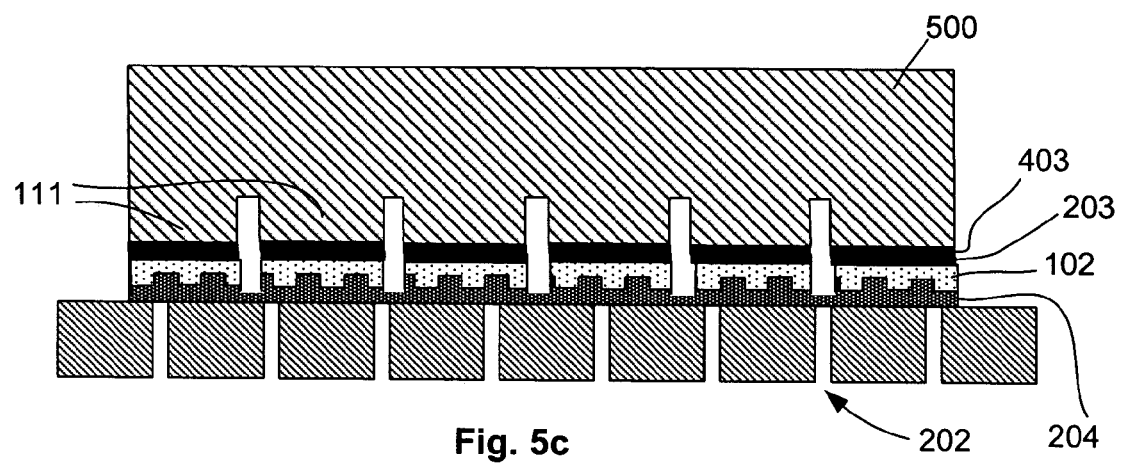
Figure 5D:
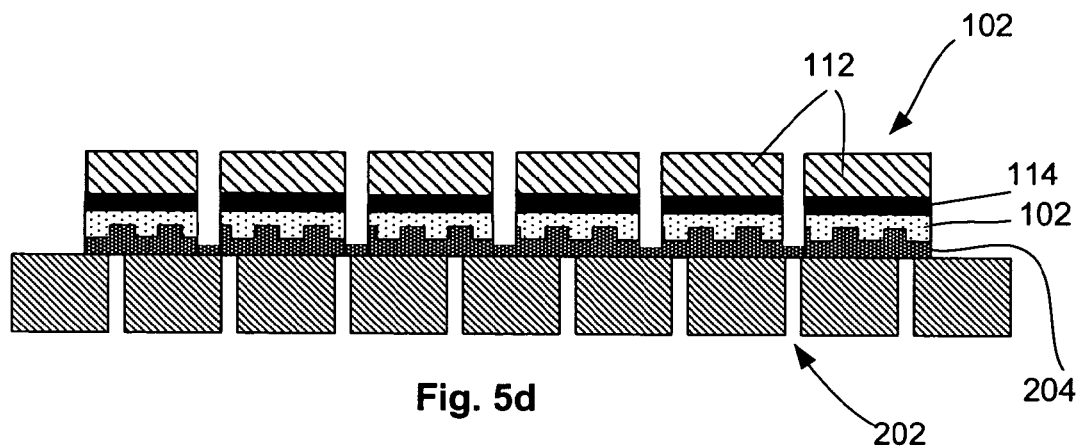
Figure 5E:
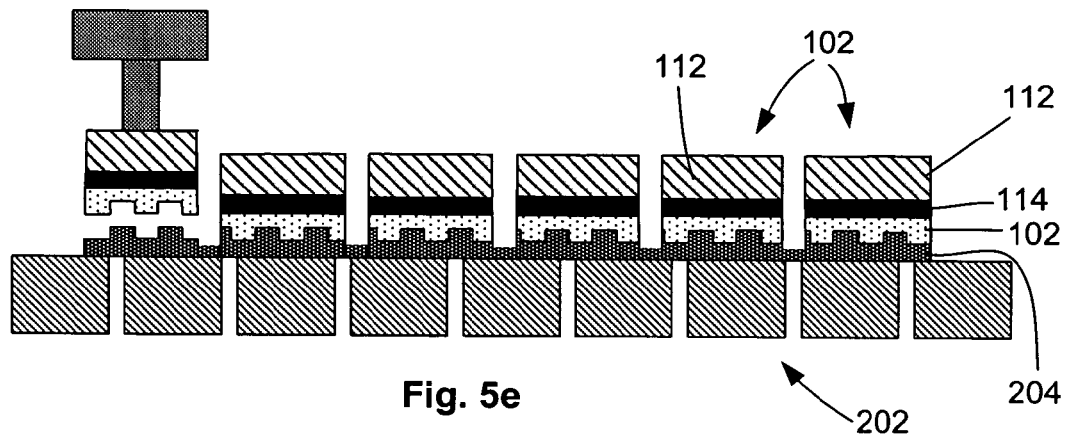
Figure 6:
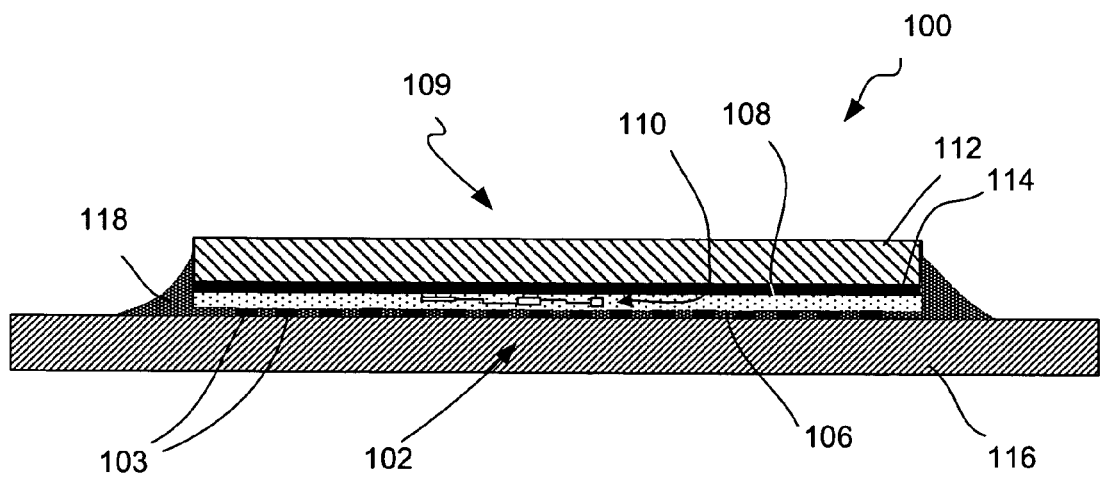
FIG. 6 is a schematic cross-sectional view of a microelectronic package according to one embodiment.

Reference is first made to FIG. 6, which shows a microelectronic package according to a first embodiment. As seen in FIG. 6, a microelectronic package 100 includes a die assembly 109 which includes a die 102, such as, for example, a die made of silicon. The die may further, according to an embodiment, include a "thin" die, that is, a die having a thickness between about 25 and about 200 microns. The die 102 has an active surface 106 and a backside 108, and further includes an integrated circuit 110, partially shown in FIG. 6. According to the shown embodiment, a thermally conductive element 112 is attached to the backside 108 of die 102 with a thermal interface material ("TIM") 114. The TIM may include any one of well known TIM's, such as, for example, solidified solder including Sn/Cu intermetallics, solidified solder including any combination of Ti, Ni, Cu, Sn and/or Au. The TIM 114 may further include a thermal grease, a thermally conductive adhesive, a phase change material or any other of the well known TIMS as would be recognized by one skilled in the art. The thermally conductive element 112 may comprise a highly thermally conductive material to extract heat away from the die, such material including, for example, metals such as copper, copper alloys including copper alloys with tungsten, copper laminates, copper composites containing particles having a thermal conductivity higher than that of copper (i.e. higher than about 400 W/m/K, such as, for example, diamond), aluminum, aluminum alloys, ceramics, SiC, diamond, and the like. In the shown embodiment, the thermally conductive element comprises a thermally conductive element, or flat film, disposed on the backside of the die 102, and thermally coupled thereto via TIM 114. It is noted, however, that embodiments are not limited to the use of a thermally conductive element in the form of a layer or plate, but includes within its scope the use of a thermally conductive element having any shape according to application needs. In addition, while the shown embodiment depicts a uniform thermally conductive element, that is, a thermally conductive element made of the same material substantially uniformly throughout its volume, embodiments are not so limited, and comprise within their scope the use of a thermally conductive element made of a number of distinct materials distributed throughout a volume of the thermally conductive element according to application needs, such as, for example, a thermally conductive element where a thermal conductivity of different portions of the thermally conductive element may be tailored as a function of heat dissipation needs of the die. In this manner, according to an embodiment, the thermally conductive element may include materials having a higher thermal conductivity than other area of the thermally conductive element at regions of the die corresponding to die hot spots. As seen in FIG. 6, according to an embodiment, the thermally conductive element is thicker than the die 102, and preferably up to about 20 times thicker than the die 102. For example, according to one embodiment, a total thickness of the die assembly 109 including the die 102, the thermally conductive element 112 and the TIM 114, may be up to about 1 millimeter. As suggested in the shown embodiment, preferably, the thermally conductive element 112 is substantially co-extensive with the die 102 in its lateral extent, that is, thermally conductive element 112 has lateral dimensions substantially equal to lateral dimensions of the die 102. Embodiments are not so limited however, and comprise within their scope a thermally conductive element having lateral dimensions that may be either smaller than lateral dimensions of the die, or larger than lateral dimensions of the die by up to a maximum amount adapted to allow a mounting of the die assembly (including die and thermally conductive element) to a package substrate. Preferably, such maximum amount is about 50%. As suggested above, in an embodiment where the thermally conductive element is larger than lateral dimensions of the die, such maximum amount is among others to allow a structural reinforcement of the die, for example of a die having a thickness below about 100 microns, while still allowing a mounting of such die to a package substrate. In this manner, thermally conductive element according to embodiments is to be distinguished from a heat spreader having dimensions, including lateral dimensions, much larger with respect to the lateral dimensions of the die than the noted maximum amount. Where the thermally conductive element according to an embodiment has lateral dimensions larger than lateral dimensions of the die, more preferably, such thermally conductive element is larger only by an extent adapted to allow a wafer level attachment of the thermally conductive element to the backside of the die. According to an embodiment, for example, a thermally conductive element may have lateral dimensions that are up to about 10% larger than lateral dimensions of the die. A provision of a thermally conductive element 112 having lateral dimensions smaller than the die, substantially equal to the die, or larger than the die by the noted maximum amount to allow wafer-level processing, allows a high volume manufacturing of packages such as package 100 as will be explained in relation to FIGS. 1-5e below. In the shown embodiment, die 102 is shown as having been mounted onto, that is, mechanically and electrically bonded to, a package substrate 116, which may, according to one embodiment, include an organic or laminate material, as is well known in the art. Die 102 is shown as having been mounted onto package substrate 116 according to a flip chip mounting regime including solder joints 103 in a well known manner, and further including the use of an underfill material 118 as shown in order to mitigate for differences in CTE's between the package substrate 116 and the die 102. However, embodiments comprise within their scope a microelectronic package where the die is bonded to the package substrate in any one of the well known manners, such as, for example, through wire bonding, and further to a microelectronic package where a flip chip bonding of the die to the package substrate does not necessarily involve use of an underfill material. Preferably, the thermally conductive element 112 and TIM 114 are configured and disposed on the die 102 such that an effective CTE of the die assembly 109 (including the die 102, thermally conductive element 112 and TIM 114) is substantially equal to a CTE of the package substrate 116.

Figure 7:
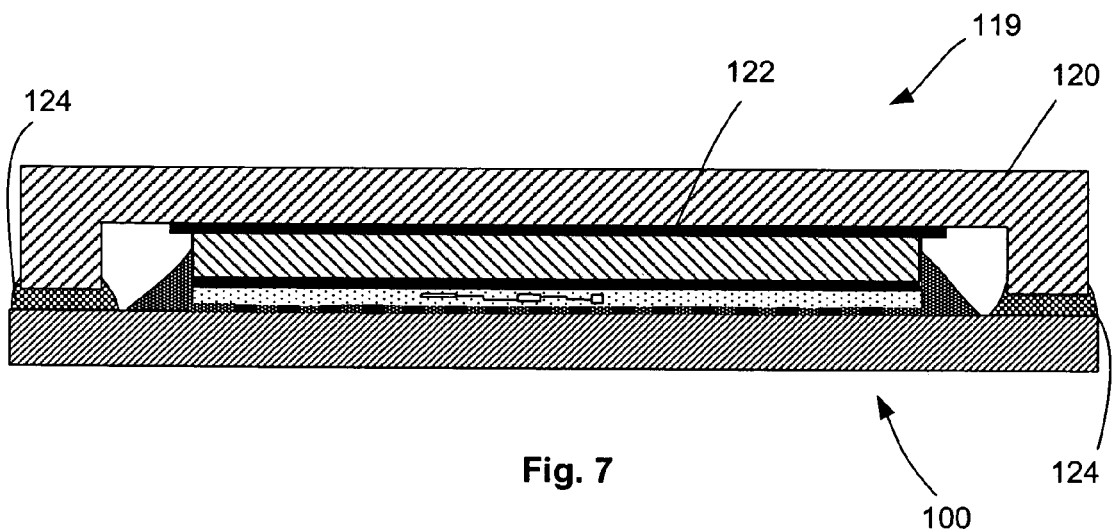
FIG. 7 is a schematic cross-sectional view of a microelectronic package according to another embodiment.

Referring now to FIG. 7, a second embodiment of a microelectronic package is shown. Here, microelectronic package 119 includes package 100 of FIG. 6, and further includes a heat spreader 120 thermally coupled to the package 100 by way of a TIM 122. Heat spreader 120 may preferably be made of a material similar to materials listed above for forming the thermally conductive element, such as, for example, metals (such as copper, aluminum, and alloys thereof), ceramics (such as SiC and AlN), and diamond, and may have any configuration adapted to remove heat from the die, such as, for example, a heat spreader integrated with a heat pipe, microchannels, a vapor chamber, or other structures adapted to remove thermal energy according to application needs. TIM 122 may include a solder, a thermally conductive adhesive, or a thermal grease. As shown in FIG. 7, the heat spreader 120 may be sealed to the package substrate via seals 124 in a well known manner.

Reference will now be made to FIGS. 1-5e to describe two different method embodiments for fabricating a microelectronic die assembly such as assembly 109 of FIGS. 6 and 7 described above. FIGS. 1-3b pertain to the provision of a die wafer including die portions adapted to be used in respective microelectronic dies according to an embodiment. FIGS. 4a-4e pertain to the provision and attachment, according to a first embodiment, of a thermally conductive element, such as thermally conductive element 112 of FIGS. 6 and 7, to the backside of the dies of FIG. 3b. On the other hand, FIGS. 5a-5e pertain to the provision and attachment, according to a second embodiment, of a thermally conductive element, such as thermally conductive element 112 of FIGS. 6 and 7, to the backside of the dies of FIG. 3b. A main difference between the method embodiment of FIGS. 4a-4e on the one hand, and FIGS. 5a-5e on the other hand, lies in the fact that FIGS. 4a-4e start with individual thermally conductive elements and attach the same to backsides of respective dies, while FIGS. 5a-5e start with a thermally conductive wafer that is singulated only after attachment of the same to the backsides of respective dies. The particulars of the method embodiments of FIGS. 4a-4e, and of FIGS. 5a-5e, will be described below after a description of the provision of dies from a die wafer supported on a wafer carrier with respect to FIGS. 1-3b.

Referring now to FIG. 1-3b, a method according to embodiments comprises providing a microelectronic die, such as die 102 FIGS. 6 and/or 7 described above. According to the shown embodiment, the provision of a die includes the provision of a die wafer 200 including die portions 101. The "die portions" 101 denote portions of the wafer 200 which will, after further processing of the die wafer including singulation, and in some instances as in the case of the shown embodiment, including backside processing, result in the formation of individual dies 102 similar to die 102 of FIGS. 6 and/or 7. In the shown figure, broken lines have been used to schematically suggest the outlines of the die portions 101, although such lines may not necessarily be visible on the actual die wafer 200.

As seen in FIG. 1, the die wafer 200 shown in that figure has a first thickness t1 which is thicker than an actual thickness of the dies 102. In the shown embodiment, the die wafer 200 is mounted onto a wafer carrier 202 such as, for example, a perforated glass wafer, with the help of a detackifiable adhesive 204. It is noted that embodiments are not limited to the use of a perforated glass wafer, and include within their scope any wafer carrier adapted to carry the wafer during processing, as would be within the knowledge of one skilled in the art. By "detackifiable adhesive," what is meant in the context of the instant description is an adhesive adapted to be detackified through further processing after it has hardened or cured, such as, for example, by way of exposure of the hardened or cured adhesive to elevated temperatures, and/or to chemicals such as solvents, in any well known manner. Elevated temperatures may be achieved for example through irradiation of the adhesive, such as by exposure of the adhesive to UV irradiation from a lamp in order to elevate a temperature of the adhesive and to detackify the same. Embodiments, however, are not limited to adhesives detackifiable through elevated temperatures, and include within their scope adhesives that can be detackified after they are hardened or cured in any other manner, such as, for example, by way of soaking in a chemical stripper. The detackifying adhesive 204 may include, for example, silicones, polyimides, certain polyolefins, epoxies, acrylics and other thermally decomposable materials. According to one embodiment, the adhesive may be provided by spin-coating, spray-coating or lamination, and by a curing of the same to provide the detackifiable adhesive layer 204. The detackifying adhesive 204 may also include, according to another embodiment, a double-sided adhesive tape, as is well known in the art. The wafer carrier 202 on the other hand may include any material that does not bend or warp or otherwise change shape during backside processing of the wafer and during removal of the carrier from the wafer according to embodiments. According to one embodiment, the wafer carrier 202 is preferably comparable in size to a size of the wafer, although potentially thicker. Where the wafer carrier is a perforated substrate, such as the perforated wafer carrier 202 of FIG. 1, the perforations would allow a detackification of the adhesive 204 through supplying a chemical stripper to the adhesive 204 by way of the perforations Referring now to FIG. 2, a method embodiment comprises thinning the die wafer to a second thickness t2 which is smaller than the first thickness t1. For example, according to an embodiment, a backside processing of the die wafer may be performed, such as, for example, a backside grinding the of the die wafer to thin the same. Backside processing according to some embodiments may further include, for example, grinding, chemical-mechanical polishing, thin film deposition, etching and/or electroplating as would be recognized by one skilled in the art. According to one embodiment, the die wafer may be thinned to a thickness t2 between about 25 microns and about 100 microns. According to another embodiment, the die wafer may be thinned to thickness t2 less than about 50 microns.

Figure 3A:
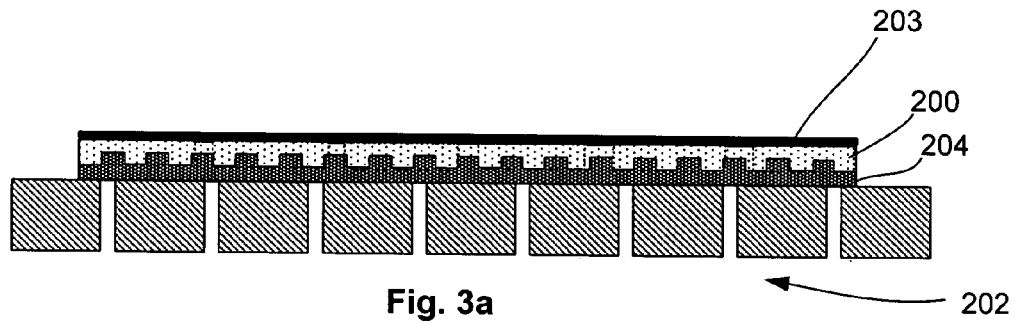

Referring next to FIG. 3a, a method embodiment includes depositing a TIM 203 on a backside 201 of the die wafer in order to allow a subsequent attachment of thermally conductive elements thereto. Depositing the TIM may include, for example, depositing a stack of metal layers, or depositing any other of the well known TIMs such as, for example, a thermally conductive adhesive. It is noted however that embodiments are not limited to an application of TIMs to a backside of the die wafer, and include within their scope the application of the TIM only to a free surfaces of the thermally conductive elements before attachment of the same to a backside of the wafer carrier. TIM application to the free surfaces of the thermally conductive elements will be explained in further detail in relation to FIGS. 4b and 5b below.

Figure 3B:
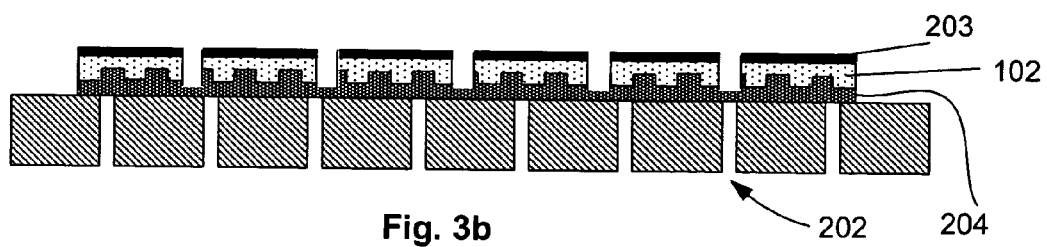

Referring now to FIG. 3b, a method embodiment comprises singulating the die wafer 200 into respective ones of the dies 102. In the shown preferred embodiment of FIG. 3b, singulating the die wafer 200 includes singulation from a backside of the die wafer 200 while the die wafer is supported by the die carrier 202. It is noted, however, that embodiments comprise within their scope a singulation of the die wafer 200 from a front surface of the same and/or at any stage in the fabrication of the die assembly 109 of FIGS. 6 and 7 according to application needs. Singulation may take place according to any one of well known methods for singulated a wafer, such as, for example, by way of laser scribing, chemical etching or sawing. Singulation may be effected in the embodiment of FIG. 3b while controlling a singulation depth such that only the die wafer 200 carrier 202 is not diced, and such that, preferably, only the die wafer 200 is diced.

A description will now be provided regarding attaching a thermally conductive element to a backside of a die as shown schematically in FIGS. 4a-4e on the one hand, and as shown schematically in FIGS. 5a-5e on the other hand.

Figure 4A:
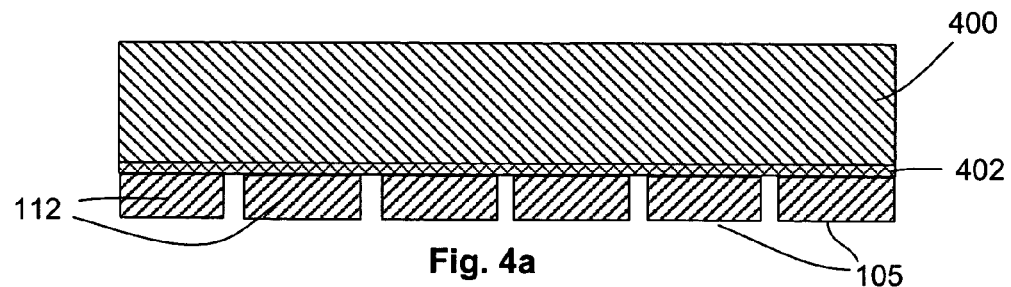
FIGS. 4a-4e are schematic views showing stages in the formation of a microelectronic die assembly using the dies of FIG. 3b according to a first embodiment.

Referring first to FIG. 4a, attaching a thermally conductive element to the backside of the die, such as dies 102 of the die wafer 200, includes, according to an embodiment, providing a plurality of thermally conductive elements by providing individual thermally conductive elements 112 and attaching the individual thermally conductive elements 112 to a rigid carrier 400 in a pattern corresponding to a pattern of the dies 102 on the wafer carrier 202 (see FIG. 3b). Thus, according to the shown embodiment, thermally conductive elements 112 may be attached to rigid carrier 400 in a predetermined pattern that is a mirror image of a pattern of dies 102 on the wafer carrier such that free surfaces 105 of each of the thermally conductive elements 112 on the rigid carrier 400 may be registered with corresponding backsides of respective ones of the dies 102 on the wafer carrier 202. According to the embodiment of FIG. 4a, the individual thermally conductive elements 112 may be provided for example by cutting through an entire thickness of the thermally conductive wafer to singulate the thermally conductive wafer into individual thermally conductive element components 112 before attachment of said components to rigid carrier 400 as described above. Other manners of providing individual thermally conductive elements would be within the knowledge of the skilled artisan. The rigid carrier 400 may, according to one embodiment, include any rigid material, such as, for example, glass. Preferably, a CTE of the rigid carrier 400 is comparable to the CTE of the wafer carrier. More preferably, the CTE of the rigid carrier is substantially equal to the CTE of the wafer carrier. Provision of the individual thermally conductive elements according to a preferred embodiment involves the provision of thermally conductive elements which have lateral dimensions that are smaller than, substantially equal, or larger than lateral dimensions of the respective dies. Where the thermally conductive element according to an embodiment has lateral dimensions larger than lateral dimensions of the die, more preferably, such thermally conductive element is larger by an extent adapted to allow a wafer level attachment of the thermally conductive element to the backside of the die. In this manner, a one to one correspondence of each individual thermally conductive element may be established with respective dies 102 on the wafer carrier 202, thus facilitating a high volume manufacturing of dies according to an embodiment.

Referring still to FIG. 4a, an attachment of the individual thermally conductive elements 112 to the rigid carrier 400 may be effected by way of a detackifiable adhesive 402, such as in the form of an adhesive film as shown. The detackifiable adhesive may comprise an adhesive similar to the detackifiable adhesive 204 described above and used to attach the die wafer 200 to the wafer carrier 202. (See FIGS. 1-3b) Where both detackifiable adhesives 204 and 402 are detackifiable by way of elevated temperatures, preferably, the detackifiable adhesive 402 is selected to have a higher detackification temperature than the detackifiable adhesive 204 in order to allow an earlier release of the dies 102 from the wafer carrier 202 followed by a later release of the individual thermally conductive elements from the rigid carrier 400.

Figure 4B:
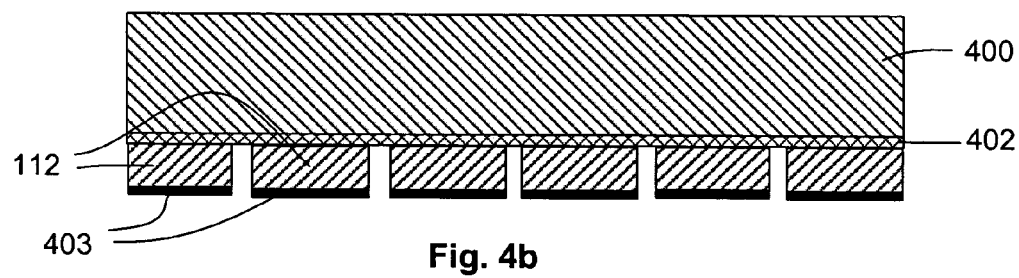

Referring next to FIG. 4b, a method embodiment includes depositing a TIM on the free surfaces 105 of the thermally conductive elements 112 in order to allow a subsequent attachment of thermally conductive elements to the backside of the dies 102. Similar to the TIM deposition described above in relation to FIG. 3a, depositing the TIM onto the free surfaces 105 of the thermally conductive elements 112 may include, for example, depositing a stack of metal layers, or depositing any other of the well known TIMs. It is noted however that embodiments are not limited to an application of TIMs to free surfaces of the thermally conductive elements, and include within their scope the application of the TIM only to the backside of the die wafer, as described above in relation to FIG. 3a. In addition, embodiments are not limited to the deposition of a TIM onto the free surfaces 105 after an attachment of the thermally conductive elements to the rigid carrier, and include within their scope the deposition of a TIM onto the free surfaces 105 before an attachment of the thermally conductive elements to the rigid carrier.

Figure 4C:
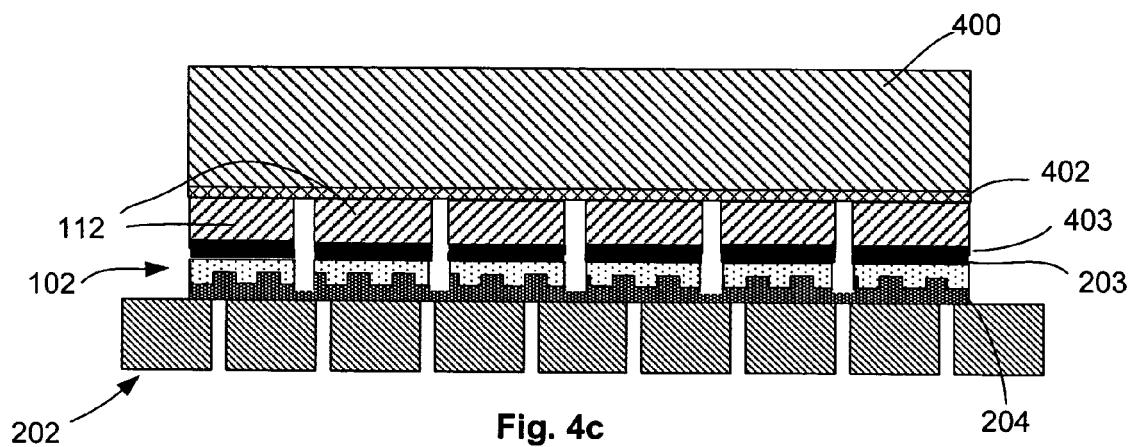

Referring now to FIG. 4c, a method embodiment includes attaching the individual thermally conductive elements 112 to the backside of the dies 102. In the shown embodiment, such attachment is effected by aligning the individual thermally conductive elements to register with respective backsides of the dies 102, and thereafter by bonding the thermally conductive elements with said respective backsides in a well known manner, such as, for example, by way of thermo-compression bonding to melt the TIM's together and to thereafter allow the TIM's to solidify to bond the thermally conductive elements to the backsides of the dies 102. For example, where the TIM's 203 and 403 include a Sn and Cu containing solder composition, thermo-compression bonding as noted above may melt such composition in a well known manner to form Sn—Cu intermetallic compounds. Preferably, where thermo-compression is used to attach the individual thermally conductive elements 112 to the backsides of the dies, the thermo-compression takes place in a vacuum chamber or in an inert environment to reduce oxidation of the metal layers. The bonding temperature may be as low as 150 degrees Celsius for a Sn and Cu containing solder composition used for the TIM's 203 and 403.

Figure 4D:
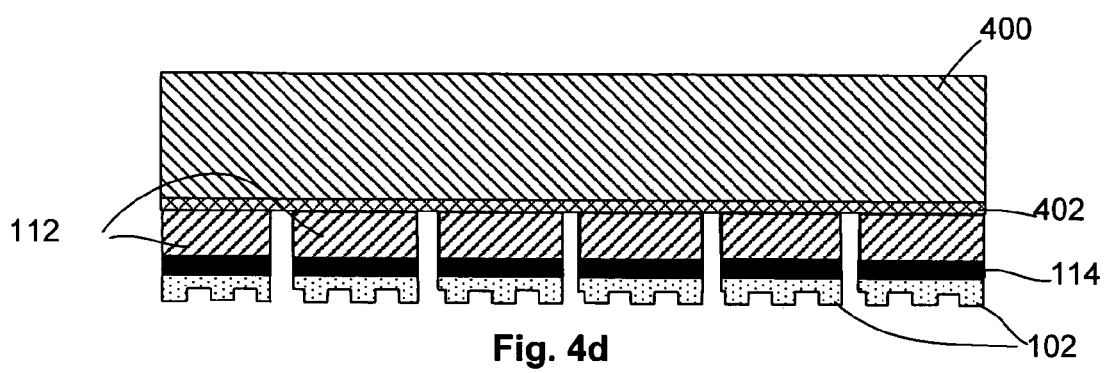

Referring next to FIG. 4d, a method embodiment comprises releasing the dies 102 from the wafer carrier 202 after attaching the thermally conductive elements to the backside of each of the dies 102. Where a detackifiable adhesive is used to mount the die wafer 200 to the wafer carrier 202 as in the case of FIG. 4c with adhesive 204, releasing the die wafer 200 from the wafer carrier 202 may comprise detackifying such adhesive, such as, for example, by exposing the adhesive 204 to raised temperatures corresponding to a decomposition temperature of the adhesive, or by exposing the adhesive 204 to irradiation, such as, for instance, laser irradiation or UV irradiation delivered by way of a lamp, to detackify the adhesive 204 in a well known manner. In such a case, use of a transparent/glass wafer carrier such as carrier 202 would make possible such release. In the alternative, the adhesive 204 may be detackified in a well known manner through the application of chemical strippers, which may be delivered to the adhesive by way of perforations in the perforated wafer carrier 202. Where the thermally conductive elements are also attached to a rigid carrier by way of a detackifiable adhesive, such as in the case of the embodiment of FIGS. 4a-4e where individual thermally conductive elements 112 are attached to rigid carrier 400 by way of detackifiable adhesive 402, and, in addition, where the detackifiable adhesive 204 used to attach the die wafer 200 to the wafer carrier 202 is one which is detackifiable by way of elevated temperatures, such adhesive 204 may preferably be selected to have a detackification or decomposition temperature that is lower than a decomposition temperature of the adhesive 402 which attaches the thermally conductive elements 112 to the rigid carrier 400. In this way, a release of the dies 102 would not automatically result in a release of the thermally conductive elements 112 from the rigid carrier 400 in a premature manner, that is, before a singulation of the die wafer into a plurality of dies, as will be explained below.

Figure 4E:
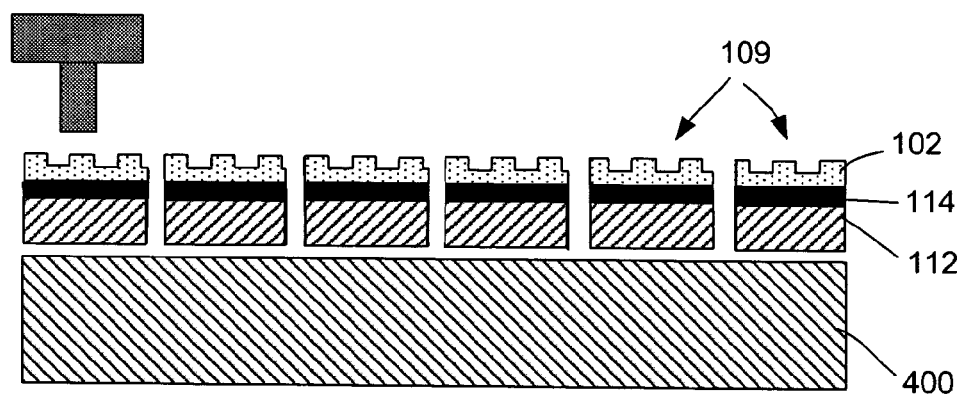

Referring finally to FIG. 4e, a method embodiment comprises releasing the individual thermally conductive elements 112 from the rigid carrier 400 after attaching each thermally conductive element to a corresponding die 102. In the embodiment of FIG. 4e, releasing the individual thermally conductive elements 112, along with the respective dies 102 bonded thereto, includes detackifying the detackifiable adhesive 402. A detackification of the adhesive 402 may take place, for example, in the same manner as described above with respect to the detackification of the adhesive 204 that bonded the dies 102 to the wafer carrier 202. A release of the individual thermally conductive elements 112 from the rigid carrier 400 results in a plurality of die assemblies 109 supported on rigid carrier 400 according to an embodiment, which microelectronic dies may be individually picked from the rigid carrier 400 in a well known manner. Each die assembly 109 includes a die 102, TIM 114 and thermally conductive element 112, as also explained above in relation to FIGS. 6 and 7 above.

A description will now be provided regarding attaching a thermally conductive element to a backside of dies as shown schematically in FIGS. 5a-5e according to an embodiment alternative to the embodiment of FIGS. 4a-4e described above.

Referring first to FIG. 5a, attaching a thermally conductive element to the backside of dies, such as dies 102, includes, according to an embodiment, providing a thermally conductive wafer 500, and cutting the thermally conductive wafer to delimit respective ones of the thermally conductive elements in a pattern corresponding to a pattern of the dies 102 on the wafer carrier 202. "Cutting" as used in the instant description refers to cutting through a portion or a totality of the thickness of the object being cut. As used herein, cutting through a totality of the thickness of a wafer would result in a "singulation" of such wafer. Thus, although in the embodiment of FIG. 4a for example, the individual thermally conductive elements 112 may be obtained by way of a singulation of thermally conductive wafer, in the embodiment of FIG. 5a, a cutting through a portion of the thickness of the thermally conductive wafer 500 may be effected in order to "delimit," or to at least partially mark the limits of, the thermally conductive elements 112 to be obtained from a singulation of such wafer. A cutting of the thermally conductive wafer 500 in a way to arrive at a pattern of the thermally conductive elements 112 corresponding to a pattern of the dies 102 on the wafer carrier may be effected in the same manner as described above with respect to FIG. 4a. Thus, according to the shown embodiment, the thermally conductive wafer 500 may be cut in a predetermined pattern that is a mirror image of a pattern of dies 102 on wafer carrier 200 such that free surfaces of each of the thermally conductive elements not yet singulated as shown in FIG. 5a may be registered with corresponding backsides of respective ones of the dies 102 on the wafer carrier 202 (see FIG. 3b). Hereinafter, the as yet unsingulated but delimited thermally conductive elements will be referred to as intermediate thermally conductive elements 111. A delimiting of the thermally conductive wafer 500 by way of cutting according to a preferred embodiment involves a delimitation of individual thermally conductive elements which, when fully singulated, would have lateral dimensions that are smaller than, substantially equal to, or larger than lateral dimensions of the respective dies. Where the thermally conductive element according to an embodiment has lateral dimensions larger than lateral dimensions of the die, more preferably, such thermally conductive element is larger by an extent adapted to allow a wafer level attachment of the thermally conductive element to the backside of the die. In this manner, a one to one correspondence of each individual thermally conductive element may be established with respective dies 102 on the wafer carrier 202, thus facilitating a high volume manufacturing of dies according to an embodiment. According to one embodiment, cutting may be effected by way of wire EDM (electrical discharge machining) or using other methods as would be within the knowledge of one skilled in the art.

Referring next to FIG. 5b, a method embodiment includes depositing a TIM 503 on the free surfaces 505 of the intermediate thermally conductive elements 111 in order to allow a subsequent attachment of the intermediate thermally conductive elements 111 to the backside of the dies 102 on the wafer carrier 202. Similar to the TIM deposition described above in relation to FIG. 3 or 4b, depositing the TIM 503 onto the free surfaces 505 of the intermediate thermally conductive elements 111 may include, for example, depositing a stack of metal layers, or depositing any other of the well known TIMs. It is noted however that embodiments are not limited to an application of TIMs to free surfaces of the intermediate thermally conductive elements, and include within their scope the application of the TIM only to the backside of the die wafer, as described above in relation to FIG. 3a.

Referring now to FIG. 5c, a method embodiment includes attaching the intermediate thermally conductive elements 111 to the backsides of the dies 102 on the wafer carrier 202. In the shown embodiment, such attachment is effected by aligning the intermediate thermally conductive elements 111 to register with respective backsides of the dies 102, and thereafter by bonding the intermediate thermally conductive elements with said respective backsides in a well known manner, such as, for example, by way of thermo-compression bonding to melt the TIM's 203 and 503 together and to thereafter allow the TIM's to solidify to bond the intermediate thermally conductive elements to the backsides of the dies 102. For example, where the TIM's 203 and 503 include a Sn and Cu containing solder composition, thermo-compression bonding as noted above may melt such composition in a well known manner to form Sn—Cu intermetallic compounds. Preferably, where thermo-compression is used to attach the intermediate thermally conductive elements 111 to the backsides of the dies 102, the thermo-compression takes place in a vacuum chamber or in an inert environment to reduce oxidation to the metal layers. The bonding temperature may be as low as 150 degrees Celsius for a Sn and Cu containing solder composition used for the TIM's 203 and 503. Preferably, a bonding temperature is selected that is close to the die operation temperature such that compressive stresses inside the die and an impact to transistor performance are negligible.

Referring next to FIG. 5d, a method embodiment comprises singulating the thermally conductive wafer 500 into individual thermally conductive elements 112. In the shown embodiment, such singulation may take place by polishing the thermally conductive wafer 500 from a backside thereof in order to yield the individual thermally conductive elements 112 as shown. Polishing may be effected according to any one of well known polishing methods, such as, for example, through chemical-mechanical polishing or CMP. Polishing may be effected to achieve a depth to result in a singulation of the thermally conductive wafer 500 by continuing the polishing until a thickness of the thermally conductive wafer equals a depth of the cuts in the thermally conductive wafer delimiting the thermally conductive elements 112.

Referring finally to FIG. 5*e*, a method embodiment comprises releasing the individual microelectronic die assemblies 109 from the wafer carrier 202 by releasing each die 102 from the wafer carrier. In the embodiment of FIG. 5*e*, releasing the individual thermally conductive elements 112, along with the respective dies 102 bonded thereto, includes detackifying the detackifiable adhesive 204. A detackification of the adhesive 204 may take place, as explained above in relation to FIG. 4*d*. A release of the individual dies from the wafer carrier 202 results in a plurality of microelectronic die assemblies 109 supported on wafer carrier 202 according to an embodiment, which microelectronic dies may be individually picked from the wafer carrier 202 in a well known manner. A detackification of the adhesive 204 allows each microelectronic die 102 to be individually picked from the wafer carrier in a well known manner.

Advantageously, embodiments enable ultra low-k ILD's, and even low-k ILD's having appreciable porosity, to be used in microelectronic dies without the delamination issues associated with a packaging of such dies. Use of a thermally conductive element mounted to a die (such as one, for example, having a thickness of about 100 microns or less) provides superior thermal performance of the die, and typically produces results far superior when compared with the performance of well known thin-die-thin-TIM packages. Method embodiments have minimal impact on the well known assembly/packaging processes, as the reinforced microelectronic die according to embodiments is adapted to be packaged in the same manner and with the same assembly tools as prior art microelectronic dies. Additionally, by allowing a wafer-level bonding process of thermally conductive elements to respective dies of the wafer, some embodiments offer potentially low cost solutions to the problems typically associated with the use of thinner dies, and especially thinner dies using low-k ILD's. As a result, microelectronic dies according to embodiments can meet thermal performance requirements for future CPU packages, as, among other things, they provide increased reliability with respect to prior art dies where ILD cracking and delamination caused by the intrinsic CTE mismatch between the die and the underlying substrate are not infrequent. For example, dies reinforced with a copper plate as the thermally conductive element may provide thermal performance that is improved by about 50% or more when compared with solder TIM packages of the prior art. In addition, advantageously, method embodiments provide a microelectronic die assembly having increased mechanical rigidity as compared with dies of the prior art, which rigidity allows more efficient and reliable handling and assembly of the die.

Figure 8:
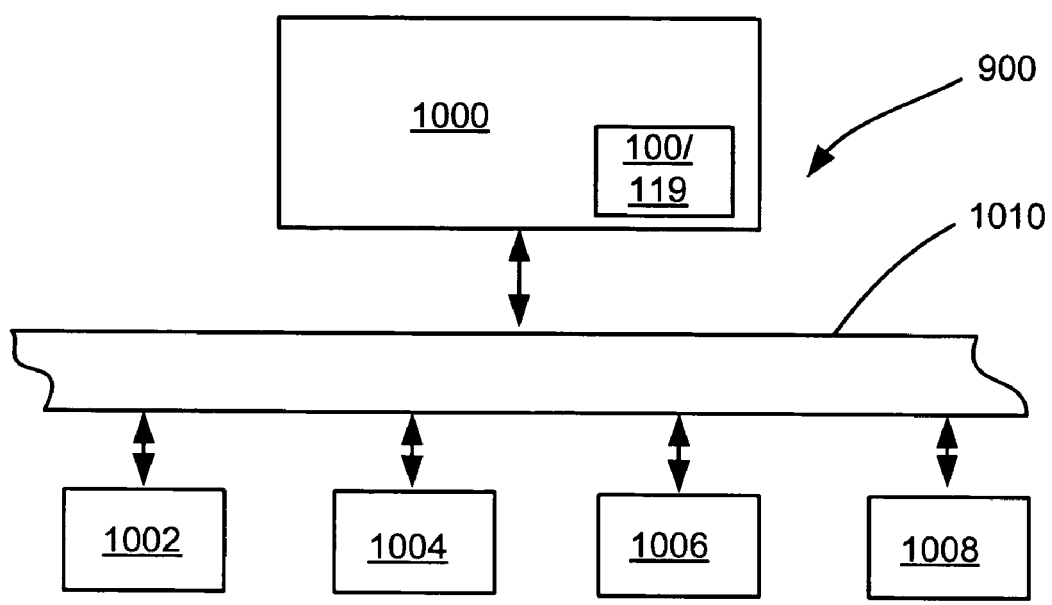
FIG. 8 is a schematic view of a system including a microelectronic package such as the one shown in either of FIG. 6 or 7.

Referring to FIG. 8, there is illustrated one of many possible systems 900 in which embodiments of the present invention may be used. In one embodiment, the electronic assembly 1000 may include a microelectronic package such as package 100 of FIG. 6 or package 119 of FIG. 7. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 8, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic die assembly comprising:
   a microelectronic die;
   a thermally conductive element attached to the backside of the die, the thermally conductive element having lateral dimensions smaller than lateral dimensions of the die by up to about 10% smaller, substantially equal to, or larger than lateral dimensions of the die by up to a maximum amount of about 10%, wherein the lateral dimensions of the thermally conductive element in relation to the lateral dimensions of the die is adapted to allow a mounting of the die assembly to a package substrate and the lateral dimensions of the thermally conductive element in relation to the lateral dimensions of the die is adapted to allow a wafer level attachment of the thermally conductive element to the backside of the die; and
   a thermal interface material attaching the thermally conductive element to the backside of the die to yield the die assembly.

2. The assembly of claim 1, wherein the thermally conductive element is up to about 20 times thicker than the die.

3. The assembly of claim 1, wherein the thermally conductive element and thermal interface material are disposed on the die such that an effective CTE of the die is substantially equal to a CTE of a package substrate adapted to be bonded to the die.

4. A microelectronic package comprising:
   a package substrate; and
   a microelectronic die assembly mounted to the package substrate and including:
      a microelectronic die;
      a thermally conductive element attached to the backside of the die, the thermally conductive element having lateral dimensions smaller than lateral dimensions of the die by up to about 10% smaller, substantially equal to, or larger than lateral dimensions of the die by up to a maximum amount of about 10%, wherein the lateral dimensions of the thermally conductive element in relation to the lateral dimensions of the die is adapted to allow a mounting of the die assembly to a package substrate and the lateral dimensions of the thermally conductive element in relation to the lateral dimensions of the die is adapted to allow a wafer level attachment of the thermally conductive element to the backside of the die; and a thermal interface material attaching the thermally conductive element to the backside of the die to yield the die assembly.

5. The package of claim 4, further comprising a heat spreader thermally coupled to the thermally conductive element.

6. The package of claim 4, wherein the thermally conductive element is up to about 20 times thicker than the die.

7. The package of claim 4, wherein the thermally conductive element and the thermal interface material are disposed on the die such that an effective CTE of the die assembly is substantially equal to a CTE of a package substrate adapted to be bonded to the die.

8. A system comprising:
an electronic assembly including:
a microelectronic package comprising:
a package substrate;
a microelectronic die assembly mounted to the package substrate and comprising:
a microelectronic die;
a thermally conductive element attached to the backside of the die, the thermally conductive element having lateral dimensions smaller than lateral dimensions of the die by up to about 10% smaller, substantially equal to, or larger than lateral dimensions of the die by up to a maximum amount of about 10%, wherein the lateral dimensions of the thermally conductive element in relation to the lateral dimensions of the die is adapted to allow a mounting of the die assembly to the package substrate and the lateral dimensions of the thermally conductive element in relation to the lateral dimensions of the die is adapted to allow a wafer level attachment of the thermally conductive element to the backside of the die; and
a thermal interface material attaching the thermally conductive element to the backside of the die to yield the die assembly; and
a main memory coupled to the electronic assembly.

9. The system of claim 8, wherein the thermally conductive element comprises copper.

* * * * *

UNITED STATES PATENT AND TRADEMARK OFFICE
CERTIFICATE OF CORRECTION

PATENT NO. : 7,626,251 B2
APPLICATION NO. : 11/529851
DATED : December 1, 2009
INVENTOR(S) : Lu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 258 days.

Signed and Sealed this

Twenty-first Day of December, 2010

David J. Kappos
*Director of the United States Patent and Trademark Office*